(12) United States Patent
Aoyama

(10) Patent No.: US 6,507,229 B1
(45) Date of Patent: Jan. 14, 2003

(54) VOLTAGE CONTROLLED DELAY CIRCUIT

(75) Inventor: Takuma Aoyama, Dusseldorf (DE)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/667,806

(22) Filed: Sep. 22, 2000

(30) Foreign Application Priority Data

Sep. 24, 1999 (JP) ............................................. 11-271252

(51) Int. Cl.[7] ................................................. H03B 5/04
(52) U.S. Cl. ......................................... 327/281; 331/57
(58) Field of Search .................................. 327/333, 261, 327/264, 272, 281, 288, 277; 331/57, 175

(56) References Cited

U.S. PATENT DOCUMENTS 5,477,182 A  * 12/1995  Huizer ........................ 327/272
5,969,577 A  * 10/1999  Kaneko ....................... 327/281

FOREIGN PATENT DOCUMENTS

JP          62-122318       6/1987
JP          401212020 A  *  8/1989  ................. 327/288

* cited by examiner

Primary Examiner—Dinh T. Le
(74) Attorney, Agent, or Firm—Finnegan, Henderson, Farabow, Garrett & Dunner LLP

(57) ABSTRACT

A voltage controlled delay circuit comprising n-type inverter delay circuits comprised of n-type inverters each having a PMOS transistor, as a load, with a source connected to a power supply node and with a gate to which a delay time amount control voltage is applied and having an NMOS transistor for driving, an NMOS transistor for bias with a drain-source pass connected between a ground node and a node at which sources of NMOS transistors of the inverter delay circuits each as a stage are commonly connected and with a gate to which a bias voltage to set to be "ON" is applied, and a push-pull inverter circuit which inputs a signal of which the amplitude changes over the entire amplitude in a range of power supply voltage to a first-stage delay circuit.

13 Claims, 3 Drawing Sheets

VOLTAGE CONTROLLED DELAY CIRCUIT

CROSS-REFERENCE TO RELATED APPLICATIONS

This application is based upon and claims the benefit of priority from the prior Japanese Patent Application No. 11-271252, filed Sep. 24, 1999, the entire contents of which are incorporated herein by reference.

BACKGROUND OF THE INVENTION

The present invention relates to a voltage controlled delay circuit and, more particularly, to a voltage controlled delay circuit using single-ended delay circuits which is, for example, used in a ring oscillator for a voltage controlled oscillator (VCO) in a phase-locked loop (PLL) circuit, and a voltage controlled delay line (VCDL).

When a ring oscillator is composed by connecting a plurality of delay elements each as a stage in the form of a loop as a VCO of a PLL circuit, there are some points to which care should be exercised in design. It is important from this point of view to decrease a phase error due to a random noise generated in a delay element and to decrease a phase error due to a variation in power supply potential. VCC/ground potential GND.

Recently, since a scale of a LSI (large scale integrated circuit) is further extended and an operation frequency therein is improved, it is not expected much to sufficiently suppress a potential variation in VCC/GND. Therefore it has been known that as a main cause of the occurrence of jitter (fluctuation of an edge of an output signal) in PLL output frequency, an effect of the voltage variation in VCC/GND is dominant more than that of the random noise.

Hence, in a PLL circuit, a differential delay circuit is used more often as a delay element of a VCO that is a core thereof. The use of the differential delay circuit improves a PSRR (Power Supply Reduction Ratio) that is an index indicative of an extent of an effect of potential variation in VCC/GND, and also enables the jitter in PLL output frequency to be reduced to a low level.

The demand for improving the operation frequency is, however, further increased, and in proportion to the demand, it is required to further decrease a level of the jitter required for the PLL and VCDL. Therefore, the differential delay circuit has been contrived also in various ways.

However in the differential delay circuit, since random noises generated in the elements are great as compared to the single-ended delay circuit and voltage amplitude is not increased so much, there are some problems that contribution of the noises to a phase error is greater than that in the single-ended delay circuit, and that it is necessary to pile up some stages of transistors in the vertical direction in order to keep constant current characteristics. These problems become more remarkable as elements are made finer and power supply voltage is further decreased in accordance with the progress of process techniques, so that a circuit design may has further difficulty.

Regarding the aforementioned points, since it is easy to obtain a low-voltage design in a single-ended delay circuit, it is known that the single-ended delay circuit is effective in solving the above problems if the problem of PSRR is only solved, and a VCO contrived in such a way is mounted, for example, on a microprocessor.

FIG. 6 illustrates an example of conventional VCO comprised of push-pull inverter delay circuits.

In FIG. 6, A P0 is a PMOS transistor (P-MOS transistor) for current supply in which a source is connected to a VCC node and a delay time amount control voltage Vcntrl is applied to a gate. Each of IV1 to IV3 is a push-pull inverter delay circuit connected between a drain node of the above PMOS transistor P0 and GND, and is connected in the form of a loop as an entire configuration to compose a ring oscillator. A decoupling capacitor Cd is connected between the drain node of the PMOS transistor P0 and GND. An output signal of the ring oscillator is output to a latter-stage circuit with the VCC shifted from an "H" level by a level shift circuit 60.

In the VCO illustrated in FIG. 6, in the case where the decoupling capacitor Cd is not connected, when the power supply voltage VCC varies, a circuit threshold and driving capability of each of the push-pull inverter delay circuits IV1 to IV3 as a push-pull stage vary, and an oscillation frequency changes.

That is, since a supply source of the control voltage Vcntrl is strongly coupled to the VCC node via capacity between the source and gate of the PMOS transistor P0 for current supply, for example, when the VCC is decreased, the control voltage Vcntrl is decreased following the decrease of the VCC, and a difference between the control voltage Vcntrl and VCC becomes little.

However, a potential of the drain node of the PMOS transistor P0 for current supply changes, and in sensitively response to the change in the potential, a delay time amount in each of the delay circuits IV1 to IV3 changes, and the oscillation frequency changes considerably.

Therefore, by connecting the decoupling capacitor Cd, it is possible to fairly suppress the variation in the potential of the drain node of the PMOS transistor P0 for current supply and to improve the PSRR.

Meanwhile, when the capacity of the decoupling capacitor Cd is excessively great, the voltage between the drain and source of the PMOS transistor P0 for current supply changes, a current supplied from the PMOS transistor P0 for current supply changes, and as a result the oscillation frequency changes to some extent and thereby becomes unstable.

In contrast to the foregoing, when the capacity of the decoupling capacitor Cd is excessively small, the effect for improving the PSRR deteriorates, and the performance of the PLL circuit is not improved more than some extent.

Accordingly as described above, the above-mentioned push-pull inverter delay circuits IV1 to IV3 have characteristics that their delay times strongly depend on the power supply voltage VCC, and therefore there is a problem that it is necessary to suppress the variation in the power supply voltage VCC in order to reduce the jitter.

As described above, in the conventional VCO provided by connecting a decoupling capacitor to a ring oscillator comprised of push-pull inverter delay circuits connected in the form of a loop, there is a problem that the capacity setting in the decoupling capacitor is difficult, and that sufficient performance is not always obtained.

BRIEF SUMMARY OF THE INVENTION

The present invention is carried out to solve the above-mentioned problems. It is an object of the present invention to provide a voltage controlled delay circuit capable of improving a PSRR with a simple configuration without connecting a decoupling capacitor, and of improving performance of a circuit applying the delay circuit.

The voltage controlled delay circuit according to the present invention comprises a plurality of inverter delay circuits connected in series (cascade), a second MOS transistor of second-conductive-type and a push-pull inverter circuit. Each of the inverter delay circuits has a MOS transistor of first-conductive-type having a drain-source pass connected to a first power supply node and a gate to which a delay time amount control voltage is applied, a first MOS transistor of second-conductive-type having a drain-source pass connected at its one end to the other end of the drain-source pass of the MOS transistor of first-conductive-type, an input node connected to the gate of the first MOS transistor, of second-conductive-type, and an output node connected between the drain-source passes of the MOS transistor of first-conductive-type and the first MOS transistor of second-conductive-type. The input node of each of the inverter delay circuits except an inverter delay circuit of a first stage is connected to the output node of another inverter delay circuit of a former stage.

The second MOS transistor of second-conductive-type has a drain-source pass connected between a common connection node to which the other end of the drain-source pass of each first MOS transistor of second-conductive-type is commonly connected and a second power supply node, and a gate to which a bias voltage is applied. An input terminal of the push-pull inverter circuit is connected to an output node of an inverter delay circuit of a last stage, and an output terminal thereof is connected to an input node of the inverter delay circuit of the first stage.

According to the above-mentioned configuration, the balance of driving forces of the first MOS transistor of second-conductive-type and the MOS transistor of first-conductive-type eliminates a variation in the driving forces depending on the variation in voltage of the first power supply node, and as a result prevents a delay time from being varied. Accordingly it is possible to improve the PSRR with a simple configuration, and to provide a voltage controlled delay circuit enabling improved performance of a circuit applying the delay circuit.

Further, since the second MOS transistor of second-conductive-type operates as a resistance in negative feedback, for example, when the voltage of the first power supply node is decreased, an "L" level of an output potential of the inverter delay circuit of each stage is decreased, and as a result, the amplitude is brought back to a level obtained before the voltage of the power supply node is decreased. Therefore, the change in the delay time or oscillation frequency is further decreased.

Furthermore, according to another aspect of the present invention, a voltage controlled delay line is provided. The voltage controlled delay line has N output taps, N inverter delay circuits and a second MOS transistor of second-conductive-type. N inverter delay circuits are connected in series. Each of the inverter delay circuits has a MOS transistor of first-conductive-type having a drain-source pass connected to a first power supply node and a gate to which a delay time amount voltage is applied, a first MOS transistor of second-conductive-type having a drain-source pass connected at its one end to the other end of the drain-source pass of the MOS transistor of first-conductive-type, an input node connected to the gate of the first MOS transistor of second-conductive-type, and an output node connected between the drain-source passes of the MOS transistor of first-conductive-type and the first MOS transistor of second-conductive-type. The input node of each of the inverter delay circuits except an inverter delay circuit of a first stage is connected to the output node of another inverter delay circuit of a former stage. The output node is connected to corresponding one of the N output taps. The second MOS transistor of second-conductive-type has a drain-source pass connected between a common connection node to which the other end of the drain-source pass of each first MOS transistor of second-conductive-type is commonly connected and a second power supply node, and a gate to which a bias voltage is applied.

According to the above-mentioned configuration, the balance of driving forces of the first MOS transistor of second-conductive-type and the MOS transistor of first-conductive-type eliminates a variation in the driving force depending on the variation in voltage of the first power supply node, and as a result prevents a delay time from being varied. Accordingly it is possible to improve the PSRR with a simple configuration, and to provide a voltage controlled delay circuit enabling improved performance of a circuit applying the delay circuit.

Further since the second MOS transistor of second-conductive-type operates as a resistance in negative feedback, for example, when the voltage of the first power supply node is decreased, an "L" level of an output potential of the inverter delay circuit of each stage is decreased, and as a result, the amplitude is brought back to a level obtained before the voltage of the power supply node is decreased. Therefore the change in the delay time or oscillation frequency is further decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to accompanying drawings.

<First Embodiment>

Figure 1:
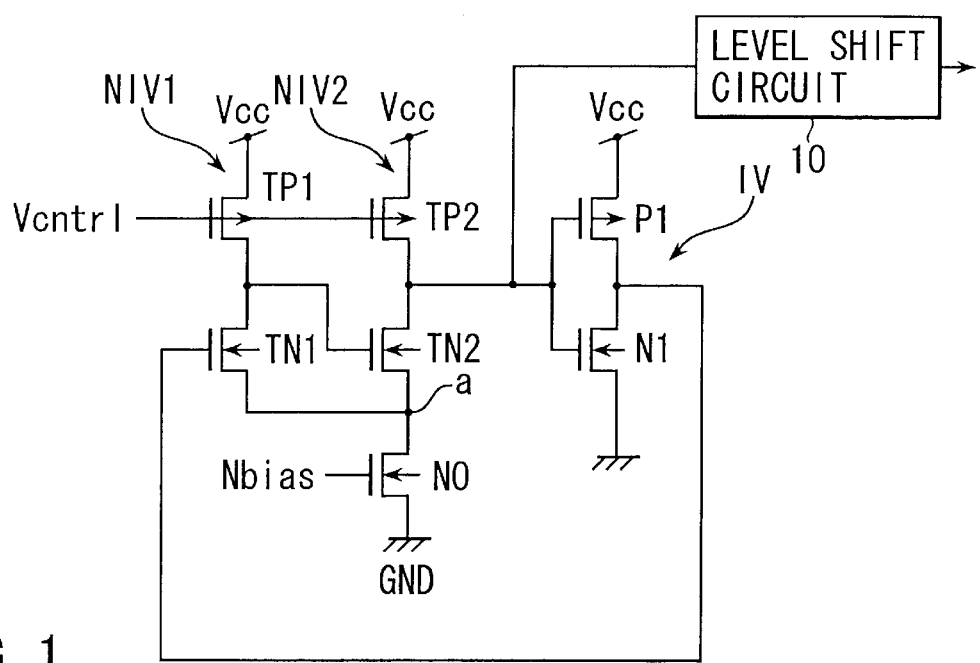
FIG. 1 is a circuit diagram illustrating an example of VCO using a voltage controlled delay circuit according to a first embodiment of the present invention.

FIG. 1 illustrates an example of VCO in a PLL circuit according to the first embodiment of the present invention.

In this VCO, each of NIV1 and NIV2 is a PMOS (P-MOS transistor) load type of n-type inverter delay circuit. A push-pull inverter circuit IV is inserted into a feedback loop in which a signal is returned from the delay circuit NIV2 of a latter stage to the delay circuit NIV1 of a first stage. An odd number of inverter circuits are connected in the form of a loop as the entire, thereby forming a ring oscillator.

A level shift circuit 10 shifts an "L" level of an output signal of the ring oscillator to a GND to output to another circuit as a latter stage such as a frequency dividing circuit in the PLL circuit.

The delay circuit NIV1 is comprised of an n-type inverter having a P-MOS transistor TP1, as a load, with a source connected to a VCC node and with a gate to which a delay time amount control voltage Vcntrl (an LPF output between PLL circuits) is applied, and having an NMOS transistor (N-MOS transistor) TN1 for driving. A connection node (output node) between the above-mentioned PMOS transistor TP1 and NMOS transistor TN1 is connected to an input node (gate of a NMOS transistor TN2) of the NIV2 as a next-stage circuit.

Similarly, the delay circuit NIV2 is comprised of an N-type inverter having a PMOS transistor TP2, as a load, with a source connected to the VCC node and with a gate to which the delay time amount control voltage Vcntrl (the LPF output between PLL circuits) is applied, and having an NMOS transistor TN2 for driving. A connection node between the above-mentioned PMOS transistor TP2 and NMOS transistor TN2 is connected to an input node of the inverter circuit IV as a next-stage circuit.

Then sources of the NMOS transistors TN1 and TN2 respectively of the delay circuits NIV1 and NIV2 are connected commonly. A drain-source pass of an NMOS transistor N0 for bias is connected between this common connection node and a GND node. A bias voltage Nbias (for example, VCC) to set the NMOS transistor N0 to be "ON" is applied to a gate of the N0.

Used as an example of the above-mentioned push-pull inverter circuits IV is a CMOS inverter circuit in which a PMOS transistor P1 and an NMOS transistor N1 are connected in series between the VCC node and GND, each gate of the transistors is connected in series and an output signal varies over the entire amplitude (with a full swing) in a range of power supply voltage.

In the configuration in FIG. 1, when it is assumed that the NMOS transistor N0 for bias is not connected, and that the PMOS loads (PMOS transistors TP1 and TP2) are operated only in a nonsaturated domain, in other words, when the output signal amplitude of the n-type inverter is held at constant, the delay time of the n-type inverter depends on the driving forces of the NMOS transistors TN1 and TN2. The driving forces vary with a variation in the power supply voltage VCC, and therefore the delay time varies too.

On the other hand, since it is designed to drive the inverter delay circuits NIV1 and NV2 with the entire amplitude (full swing) by inserting the push-pull CMOS inverter IV into the feedback loop, the output signal amplitude itself varies when the power supply voltage varies. For example, when the power supply voltage VCC drops, the output signal amplitude is decreased by an extent corresponding to the drop. Such a condition, contributes to reduction of the delay time, however, the driving ability of the NMOS transistor is decreased, thereby canceling the effect provided from the deceased output signal amplitude. In addition, a circuit threshold does not change.

The foregoing is explained in detail. The circuit threshold of each of the inverter delay circuits NIV1 and NIV2 is basically determined by a bias current flowing through the PMOS loads (PMOS transistors TP1 and TP2) and a current driving capability Gmn of the NMOS transistors TN1 and TN2. That is, the circuit threshold is a point at which the bias current and a transistor driving capability determined by the current driving capability Gmn are balanced.

Therefore, for example, a case is set such that a dimension of each of the NMOS transistors TN1 and TN2 is set to be sufficient large, and that the driving forces of the NMOS transistors TN1 and TN2 are balanced with the driving forces of the PMOS loads TP1 and TP2 when the gate voltages of the TN1 and TN2 are sufficiently smaller than the VCC. In this case, the current driving capability Gmn of the NMOS transistors TN1 and TN2 is determined by a potential difference between the gate and source. Further, when a difference between the power supply voltage VCC and control voltage Vcntrl is constant, since the PMOS loads TP1 and TP2 do not change, the circuit threshold does not change approximately even if the VCC fluctuates. When the current driving capability of the PMOS loads TP1 and TP2 and current thresholds do not change, the delay time rarely changes.

However, a little change corresponding to decreased amplitude is recognized in the delay time or oscillation frequency actually. Hence it is considered that the NMOS transistor N0 for bias be provided at a side of GND of each of the inverter delay circuits NIV1 and NIV2, and that the bias voltage Nbias to set the NMOS transistor N0 for bias to be "ON" be applied to a gate of the N0 (for example, the VCC is applied to the gate).

As a result of the foregoing, since the NMOS transistor N0 for bias operates as a resistance of the negative feedback, for example, when the VCC drops, the NMOS transistor functions to decrease the "L" level VOL of the output potential at each of the inverter delay circuits and to bring back the amplitude to a level before the VCC drops. Therefore the change in the time delay or oscillation frequency is further decreased.

Figure 6:
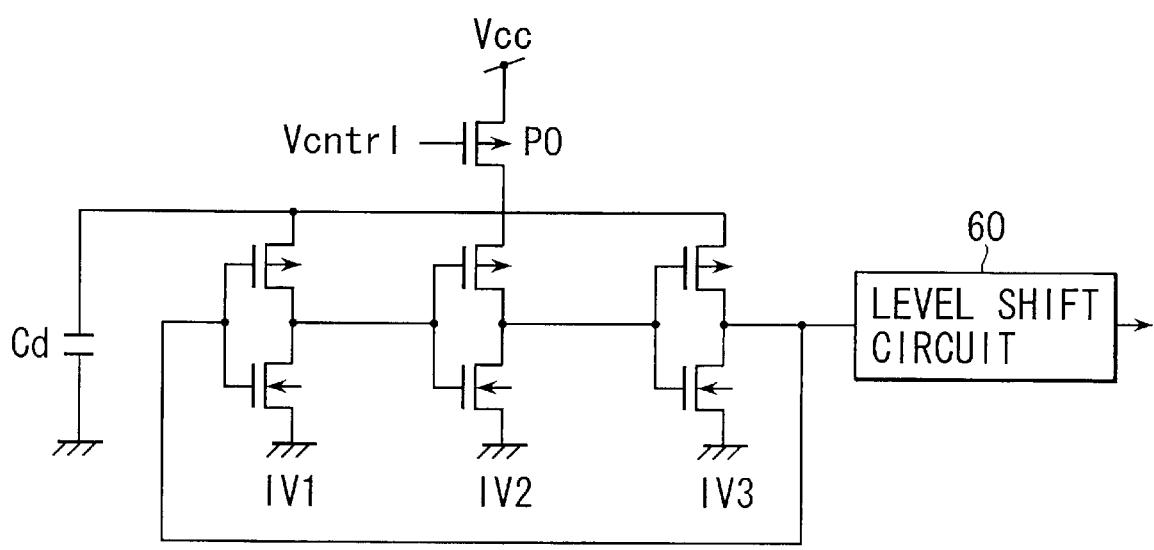
FIG. 6 is a circuit diagram illustrating an example of conventional VCO using push-pull inverter delay circuits.

In this embodiment, since the sources of the NMOS transistors TN1 and TN2 respectively of the inverter delay circuits NIV1 and NIV2 each as a stage are collectively connected, it is possible to use delay stages operating in inverted phases, and thereby to make the above-mentioned effect twice. According to the VCO in FIG. 1, it is verified that it is possible to suppress a frequency variation when the power supply varies to about 1/10 times that in a conventional example of the VCO illustrated in FIG. 6.

Figure 2:
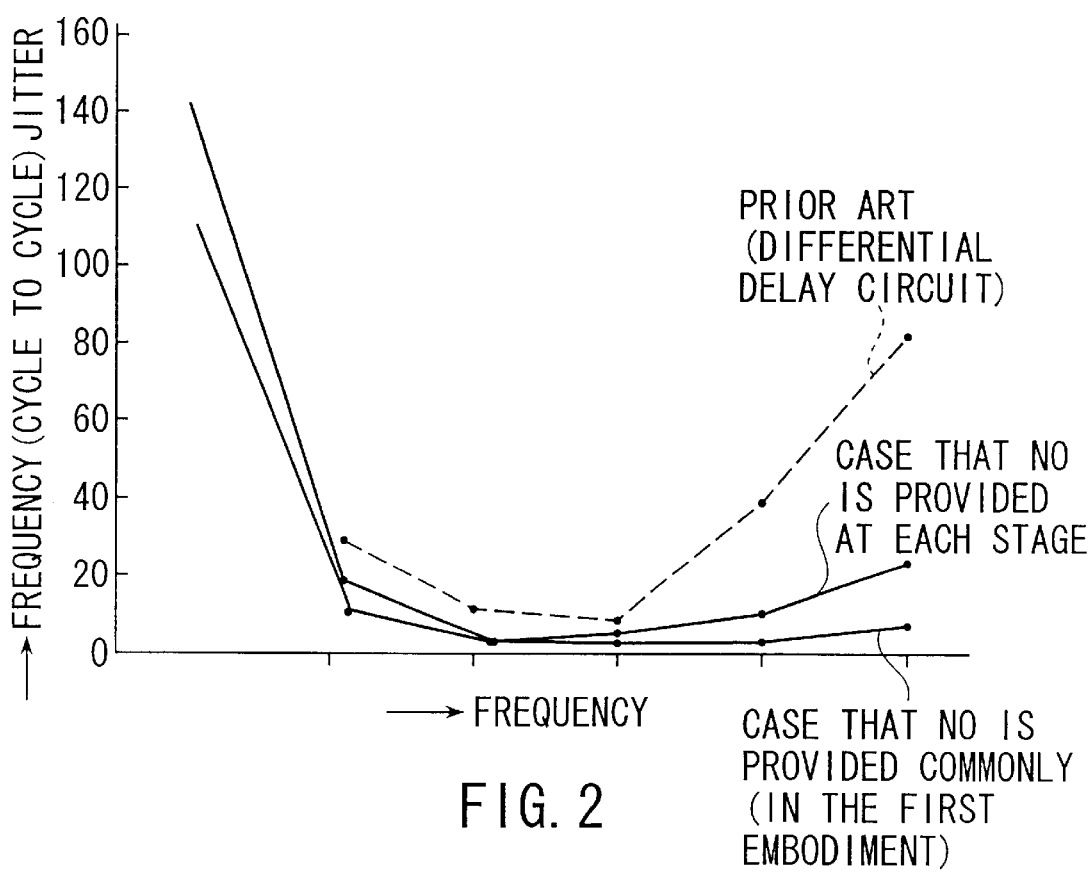
FIG. 2 is a characteristic diagram showing an example of results in simulating a relationship between an output frequency and jitter in a PLL circuit using the VCO in FIG. 1.

FIG. 2 illustrates an example of results obtained by performing simulation with respect to a state in which a relationship between the PLL output frequency and cycle-to-cycle jitter in the PLL output frequency (static characteristic of frequency/jitter) changes with the variation in the power supply.

In addition, for comparison, other results are also illustrated, one of which was obtained by performing simulation with respect to a circuit in which the NMOS transistor N0 for bias is provided at each stage for each of the NMOS inverters NIV1 and NIV2, and another of which was obtained by performing simulation with respect to a VCO comprised of three conventional differential delay circuits.

It is apparent from FIG. 2 that the jitter characteristic is improved by, like this embodiment, collectively connecting the sources of the NMOS transistors TN1 and TN2 respectively of the inverter delay circuits NIV1 and NIV2, and further connecting the connection node to the GND via the NMOS transistor N0 for bias.

Further according to the PLL circuit using the VCO of this embodiment, it is easy to adjust the output frequency by the control voltage Vcntrl and to increase the output frequency, enabling improved performance.

<Modification Example 1 in the First Embodiment>

Figure 3:
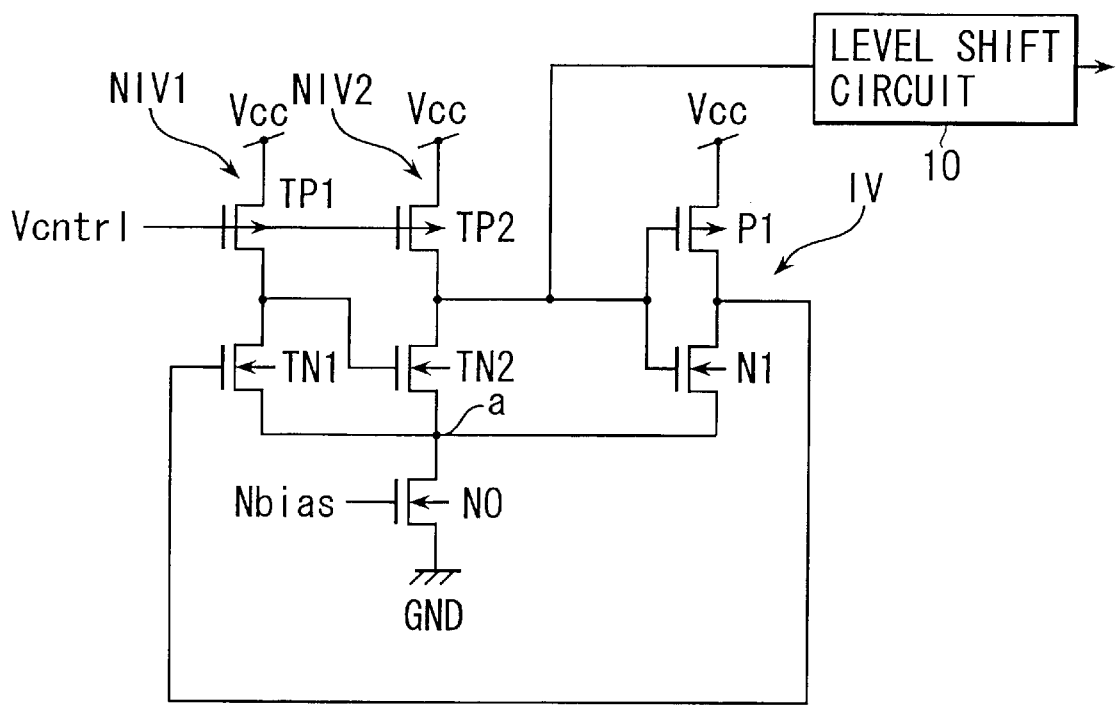
FIG. 3 is a circuit diagram illustrating a modification example 1 of the VCO illustrated in FIG. 1.

FIG. 3 illustrates the modification example 1 of the VCO illustrated in FIG. 1.

The modified VCO is the same as the VCO illustrated in FIG. 1 with the exception that a source of the NMOS transistor N1 for driving in the push-pull inverter circuit IV is commonly connected to the sources of the NMOS transistors TN1 and TN2 respectively in the inverter delay circuits NIV1 and NIV2. The same reference numerals as in FIG. 1 are used in FIG. 2.

The above-mentioned effect is also obtained in this modification example.

<Modification Example 2 in the First Embodiment>

Figure 4:
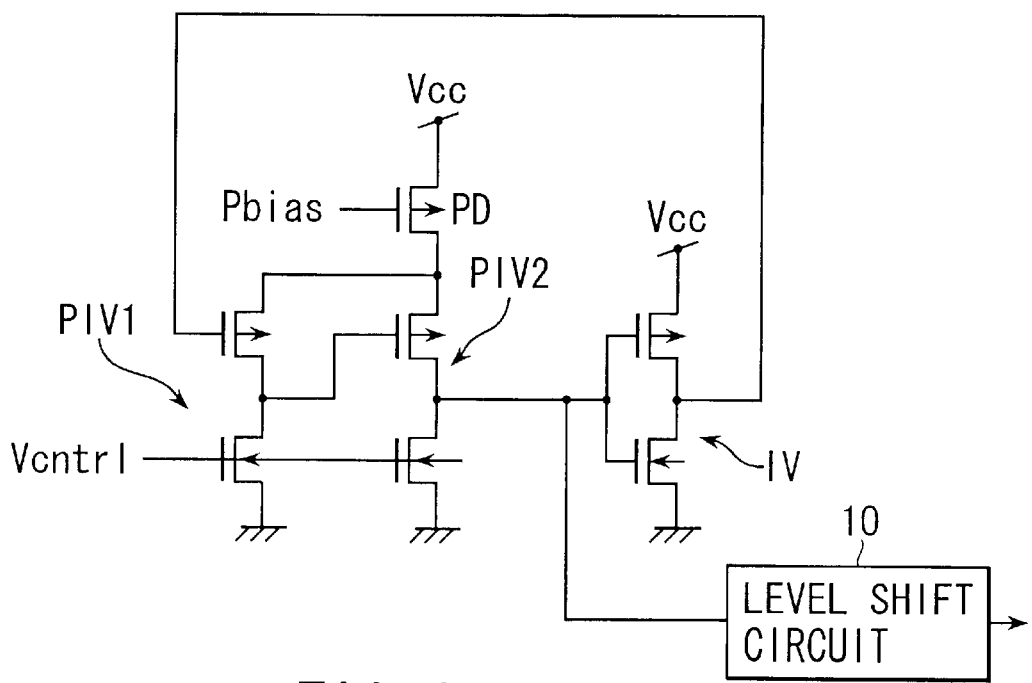
FIG. 4 is a circuit diagram illustrating a modification example 2 of the VCO illustrated in FIG. 1.

FIG. 4 illustrates the modification example 2 of the VCO illustrated in FIG. 1.

The modified VCO is different from the VCO in FIG. 1 in points that the PMOS transistor is changed to an NMOS transistor, the NMOS transistor is changed to a PMOS transistor, and that the relationship between the VCC node and GND is reversed. In FIG. 4, each of PIV1 and PIV2 is a p-type inverter delay circuit, IV is a push-pull inverter circuit, and P0 is a PMOS transistor for bias.

The above-mentioned effect is also obtained in this modification example.

<Second Embodiment>

Figure 5:
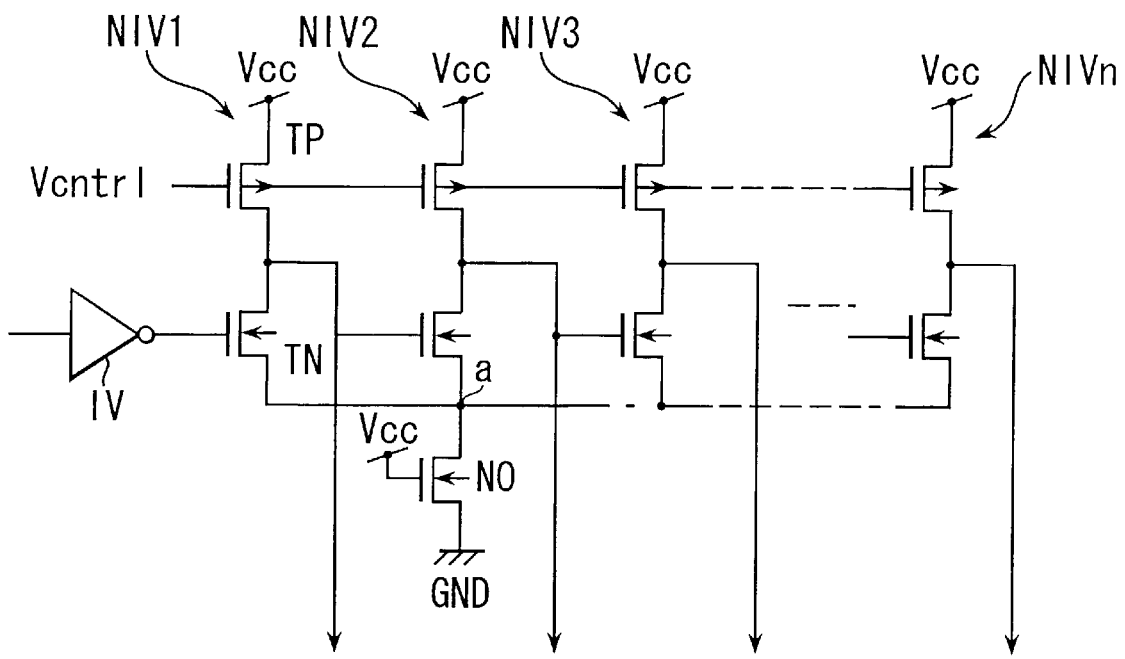
FIG. 5 is a circuit diagram illustrating an example of VCDL according to a second embodiment of the present invention.

FIG. 5 illustrates an example of voltage controlled delay lines (VCDL) according to the second embodiment of the present invention.

In this VCDL, each of NIV1 to NIVn is a PMOS load type inverter delay circuit, and connected in cascade. Each of the delay circuits NIVI, NIV2, NIV3 to NIVn is comprised of an n-type inverter having respective one of PMOS transistors TP1, TP2, TP3 to TPn, as a load, each with a source connected to a VCC node and with a gate to which a delay time amount control voltage Vcntrl is applied, and having respective one of NMOS transistors TN1, TN2, TN3 to TNn for driving. A series connection node (output node) of the PMOS transistor and NMOS transistor in each inverter circuit is connected to an input node (gate of the NMOS transistor) of another inverter delay circuit as a next stage. For example, a series connection node of the TP1 and TN1 in the inverter delay circuit NIV1 is connected to a gate of the NMOS transistor TN2 for driving in the inverter delay circuit NIV2 as a next stage. Similarly, a series connection node of the TP2 and TN2 in the inverter delay circuit NIV2 is connected to a gate of the NMOS transistor TN3 for driving in the inverter delay circuit NIV3 as a next stage.

Then, a drain-source pass of an NMOS transistor N0 for bias is connected between a GND node and a node a at which sources of the NMOS transistors TN1, TN2, TN3 to TNn respectively of a plurality of stages of delay circuits NIV1, NIV2, NIV3 to NIVn are connected commonly. A bias voltage (the VCC in this example) to set the N0 to be "ON" is applied to a gate of the N0.

Further, a push-pull inverter circuit IV is inserted into an input side of a first one of the plurality of stages of inverter delay circuits NIV1, NIV2, NIV3 to NIVn (specifically a gate of the NMOS transistor TN1 for driving in the inverter delay circuit NIV1). The push-pull inverter circuit IV inputs its output signal of which the amplitude varies over the entire amplitude in a range of power supply voltage, and a signal to be subjected to the delay control is input to the push-pull inverter circuit IV.

According to the VCDL with the above configuration, since the same characteristics as the ring oscillator as described previously are adopted, an excellent PSRR is provided and improved performance is expected.

As described above, according to the present invention, a plurality of single-ended delay circuits are connected each as a stage, and a MOS transistor for bias to be shared is inserted into a power supply node side of one end of each of the delay circuits. It is thereby possible to improve the PSRR with a simple configuration without connecting a decoupling capacitor, and to provide a voltage controlled delay circuit or voltage controlled delay line enabling improved performance of a circuit applying the delay circuit or delay line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage controlled delay circuit comprising:
a plurality of cascade-connected inverter delay circuits including a first stage inverter delay circuit and a last stage inverter delay circuit, each comprising:
a first MOS transistor of a first-conductive-type having a drain-source path connected at one end to a first power supply node and a gate to which a delay time amount control voltage is applied;
a second MOS transistor of a second-conductive-type having a drain-source path connected at its one end to the other end of the drain-source path of the first MOS transistor;
an input node connected to the gate of the second MOS transistor of the second-conductive-type; and
an output node connected between the drain-source paths of the first MOS transistor and the second MOS transistor, wherein the input node of each of the inverter delay circuits except for the first stage inverter delay circuit is connected to the output node of a preceding inverter delay circuit;
said voltage controlled delay circuit further comprising:
a third MOS transistor of the second-conductive-type including:
a drain-source path connected between a second power supply node and a common connection node to which the other end of the drain-source path of each second MOS transistor of the second-conductive-type is commonly connected; and
a gate to which a bias voltage is applied, said bias voltage having a voltage value to make said third MOS transistor function as a negative feedback resistor with respect to a power supply voltage change occurring at said first power supply node; and
a push-pull inverter circuit connected between said first and second power supply nodes and including an input terminal connected to an output node of the last stage inverter delay circuit, and an output terminal connected to an input node of the first stage inverter delay circuit.

2. A voltage controlled delay circuit according to claim 1, wherein said push-pull inverter circuit is inserted in a feedback loop for feeding back a signal from said last stage inverter delay circuit to said first stage inverter circuit.

3. A voltage controlled delay circuit according to claim 1, wherein said push-pull inverter circuit comprises a CMOS inverter circuit including a driving transistor, said driving transistor having a drain-source path connected at one end to said common connection node.

4. A voltage controlled delay circuit according to claim 1, wherein said first MOS transistor is a p-type MOS transistor, and said second and third MOS transistors of second-conductive-type are n-type MOS transistors.

5. A voltage controlled delay circuit according to claim 4, wherein a power supply voltage is applied to said first power supply node, and said second power supply node is grounded.

6. A voltage controlled delay circuit according to claim 1, wherein said first MOS transistor is an n-type MOS transistor, and said second and third MOS transistors of second-conductive-type are p-type MOS transistors.

7. A voltage controlled delay circuit according to claim 6, wherein said first power supply node is grounded, and a power supply voltage is applied to said second power supply node.

8. A voltage controlled delay circuit according to any one of claims 1 to 7, further comprising a level shift circuit, wherein an input of said level shift circuit is connected to a node arranged between the output of said last stage inverter circuit and the input of said push-pull inverter circuit, and said level shift circuit outputs an output signal generated by shifting an output of said last stage inverter circuit to a predetermined level.

9. A voltage controlled delay line comprising:
  a plurality of output taps;
  a plurality of cascade-connected inverter delay circuits including a first stage inverter delay circuit and a last stage inverter delay circuit, each comprising:
    a first MOS transistor of a first-conductive type having a drain-source path connected to a first power supply node and a gate to which a delay time amount control voltage is applied;
    a second MOS transistor of a second-conductive-type having a drain-source path connected at its one end to the other end of the drain-source path of the first MOS transistor of the first-conductive-type;
    an input node connected to the gate of the second MOS transistor of the second-conductive-type; and
    an output node connected between the drain-source paths of the first MOS transistor and the second MOS transistor;
  wherein the input node of each of the inverter delay circuits except for the first stage inverter delay circuit is connected to the output node of a preceding inverter delay circuit, and the output node is connected to corresponding one of the plurality of output taps; and
  a third MOS transistor of the second-conductive-type including:
    a drain-source path connected between a second power supply node and a common connection node to which the other end of the drain-source path of each second MOS transistor of the second-conductive-type is commonly connected; and
    a gate to which a bias voltage is applied, said bias voltage having a voltage value to make said third MOS transistor function as a negative feedback resistor with respect to a power supply voltage change occurring at said first power supply node.

10. A voltage controlled delay circuit according to claim 9, wherein said first MOS transistor is a p-type MOS transistor, and said second and third MOS transistors of the second-conductive-type are n-type MOS transistors.

11. A voltage controlled delay circuit according to claim 10, wherein a power supply voltage is applied to said first power supply node, and said second power supply node is grounded.

12. A voltage controlled delay circuit according to claim 9, wherein said first MOS transistor is an n-type MOS transistor, and said second and third MOS transistors of the second-conductive-type are p-type MOS transistors.

13. A voltage controlled delay circuit according to claim 12, wherein said first power supply node is grounded, and a power supply voltage is applied to said second power supply node.

* * * * *